US007024008B2

(12) United States Patent
Narasimhan et al.

(10) Patent No.: US 7,024,008 B2
(45) Date of Patent: *Apr. 4, 2006

(54) ACOUSTIC QUALITY ENHANCEMENT VIA FEEDBACK AND EQUALIZATION FOR MOBILE MULTIMEDIA SYSTEMS

(75) Inventors: Anand Narasimhan, Beverly Hills, CA (US); Ganesh Nachiappa Ramaswamy, Ossining, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 837 days.

This patent is subject to a terminal disclaimer.

(21) Appl. No.: 09/858,348

(22) Filed: May 17, 2001

(65) Prior Publication Data

US 2001/0033665 A1 Oct. 25, 2001

Related U.S. Application Data

(62) Division of application No. 08/935,979, filed on Sep. 23, 1997, now Pat. No. 6,252,968.

(51) Int. Cl.
*H03G 5/00* (2006.01)
*H04R 29/00* (2006.01)

(52) U.S. Cl. ........................ 381/103; 381/102; 381/56; 381/59

(58) Field of Classification Search ................ 381/103, 381/102, 56, 58, 59, 98, 96; 379/388, 389; 700/94
See application file for complete search history.

(56) References Cited

U.S. PATENT DOCUMENTS

| | | | | |
|---|---|---|---|---|
| 5,297,198 | A * | 3/1994 | Butani et al. | 381/57 |
| 5,600,718 | A * | 2/1997 | Dent et al. | 379/406.06 |
| 5,680,450 | A * | 10/1997 | Dent et al. | 379/406.08 |
| 5,818,945 | A * | 10/1998 | Makino et al. | 379/406.08 |
| 6,252,968 | B1 * | 6/2001 | Narasimhan et al. | 381/103 |

* cited by examiner

*Primary Examiner*—Stella Woo
(74) *Attorney, Agent, or Firm*—Douglas W. Cameron; Anne Vachon Dougherty

(57) ABSTRACT

A method of enhancing the audio quality in a reproduction medium having unknown characteristics. With this method a predetermined finite set of single frequency tones are generated and these tones are then passed through the reproduction medium to generate an output signal, which in turn is passed through a set of sub-band filters. Each of the sub-band filters pass at least a frequency corresponding to one of the tones in the set of tones. The characteristics of the reproduction medium is then estimated as a result of passing the output signal through the set of sub-band filters. Based on the estimated characteristics of the reproduction medium, a set of sub-band inverse filters are constructed. Finally before passing the audio signal through the reproduction medium the signal is passed through the set of inverse filters to improve the quality of the audio signal after it passes through the reproduction medium.

8 Claims, 3 Drawing Sheets

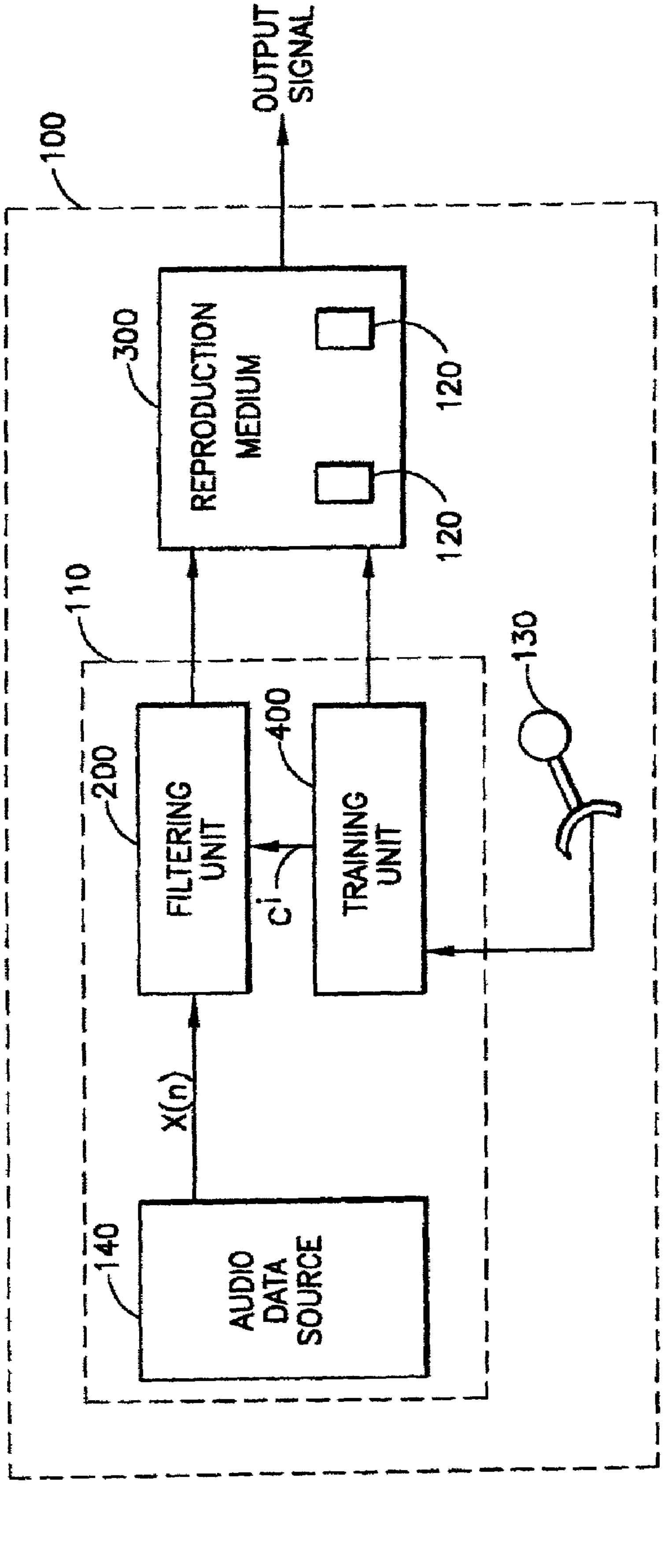
FIG.2
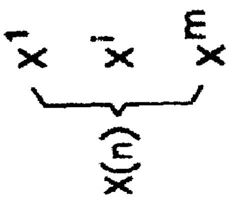

ACOUSTIC QUALITY ENHANCEMENT VIA FEEDBACK AND EQUALIZATION FOR MOBILE MULTIMEDIA SYSTEMS

This is a division of application Ser. No. 08/935,979, filed Sep. 23, 1997 now U.S. Pat. No. 6,252,968.

DESCRIPTION

1. Technical Field

The invention relates to the audio reproduction where the quality of the acoustic source is affected by unknown and possibly time-varying characteristics of the reproduction equipment and the environment, and, more particularly, relates to the audio reproduction in mobile multimedia systems where the low-cost speakers and the constantly changing environment introduce distortions to audio signals.

2. Description of the Prior Art

Audio reproduction in a mobile multimedia system often suffers from distortions introduced by poor quality speakers, and environmental fluctuations.

The subject of audio quality enhancement has been researched in considerable detail over the years. [1], [2], and the references contained therein provide some relevant background. The idea of using feedback of the audio source, modeling the reproduction medium as a filter, and inverse filtering (equalizing) the effects of the reproduction medium is central to most of these approaches. The mechanisms for estimation of the medium, and for equalization vary considerably. Reference [1] studies the problems encountered in using inverse filters. Primarily, since the impulse response of the reproduction medium tends to be long, the length of an inverse filter is also long, leading to computationally intensive algorithms. Further, a number of algorithms for implementing inverse filters tend to be unstable. Reference [1] presents a method where the length of the inverse filter is shortened by using all-pole modeling and vector quantization of responses of the reproduction medium Reference [2] describes an audio system using an equalizer for gain control and for compensating for the medium's frequency response. The approach is computationally intensive, and is not intended for adaptive use. Once the medium's frequency response is measured, the equalizer parameters are fixed. This approach is reasonably good, but only for static environments, and in addition, it is quite computationally complex.

SUMMARY OF THE INVENTION

The invention addresses the problem of acoustic quality enhancement for such and similar systems, where the subjective quality of the audio source is affected by unknown and possibly time-varying characteristics of the reproduction equipment and the environment. The invention presupposes that the computational complexity of the proposed solution must be kept to a minimum because mobile systems have limited resources, and that the solution should not result in excessive delays in audio source reproduction. The invention provides a means for estimating and compensating for the undesirable characteristics while minimizing both the computational complexity and the delay in audio source reproduction as required, and allow subsequent reproduction of an audio source that is better matched to the intended audio output.

This invention proposes to estimate the characteristics of the reproduction medium using a training signal consisting of a set of pure frequency tones generated solely for the purpose of training, which also satisfies the low-complexity and short delay requirements described above, since the proposed filters that equalize the characteristics of the reproduction medium have short lengths and the filter coefficients may be calculated with minimal complexity due to the simplicity of the training signal. Furthermore, this invention addresses the problem of acoustic quality enhancement in a dynamic environment, as opposed to the static environments considered in the prior art, since we propose to use the existing microphone and speakers, which form integral components of a mobile multimedia system. Thus, the process of estimating and compensating for the undesirable characteristics of the reproduction medium may be done adaptively and repeatedly as deemed necessary.

Consider an audio source, amplified and then reproduced through a set of speakers. A microphone is used to feed back the reproduced audio source, into a processing mechanism. This processing mechanism in turn, controls subsequent audio reproduction. The processing mechanism may operate in two phases. In the first phase, which is the training phase, the medium's characteristics will be estimated, and a set of filters is constructed, with fixed parameters. The set of filters will subsequently pre-filter the audio source, in order to equalize for the medium's characteristics, during the second phase which is the processing phase. If necessary, the pre-filter parameters may be updated by feedback of the reproduced audio source, even after the initial training period.

According to this invention, during the training phase, unique frequency tones are transmitted (e.g., via speakers), and then recorded (e.g., via a microphone). Each fed-back audio frequency tone is then used to estimate the gain of the reproduction medium at that particular frequency, and the background noise parameters at that frequency are also determined This invention is used to construct a set of inverse filters, so the original audio source can then be pre-filtered to produce the desired audio output.

During the second phase, which is the processing phase for playing back an audio source, the audio source is decomposed into sub-bands whose center frequencies are the frequency tones used for training. In each sub-band, the audio signal component is pre-emphasized by the gain estimates obtained during training, and also inverse filtered using the parameter estimates obtained during training. The resulting signal is then reconstructed into a full-band signal, resulting in an actual audio output signal that is better matched to the intended audio output.

BRIEF DESCRIPTION OF THE DRAWINGS

FIG. 2 is a more detailed schematic of the system used in this invention.

DESCRIPTION OF THE PREFERRED EMBODIMENT

Figure 1:
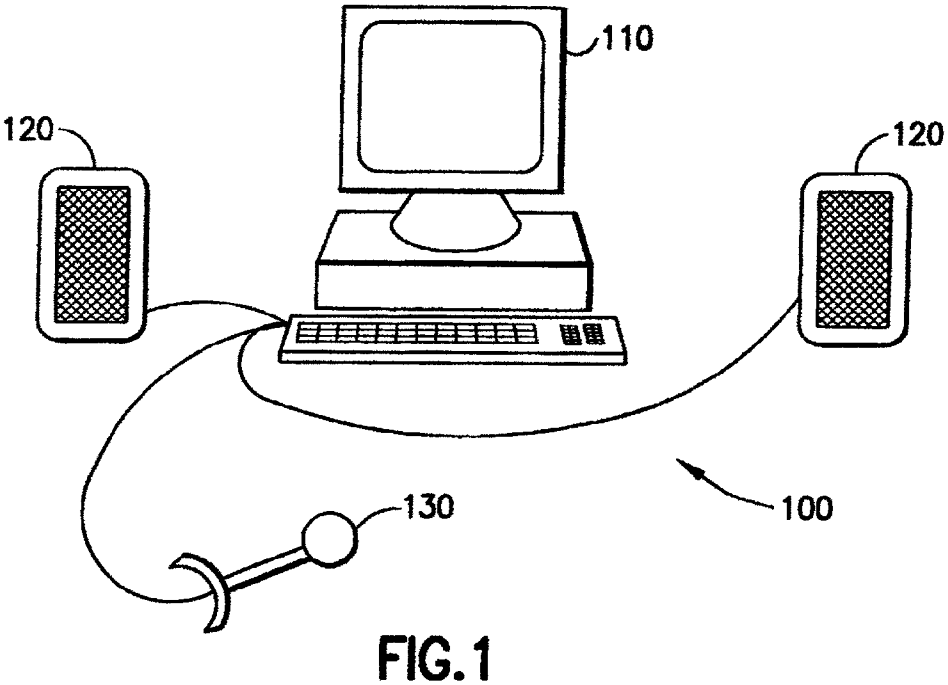
FIG. 1 schematically illustrates the overall system in accordance with the invention.

FIG. 1 illustrates the overall system of the invention. Shown is computer 110, speakers 120 and microphone 130. FIG. 2 is a more detailed schematic of system 100. Computer 110 comprises the audio data source 140, the filtering unit 200, and the training unit 400. Also shown in FIG. 2 is the reproduction medium 300, which includes speakers 120.

Figure 3:
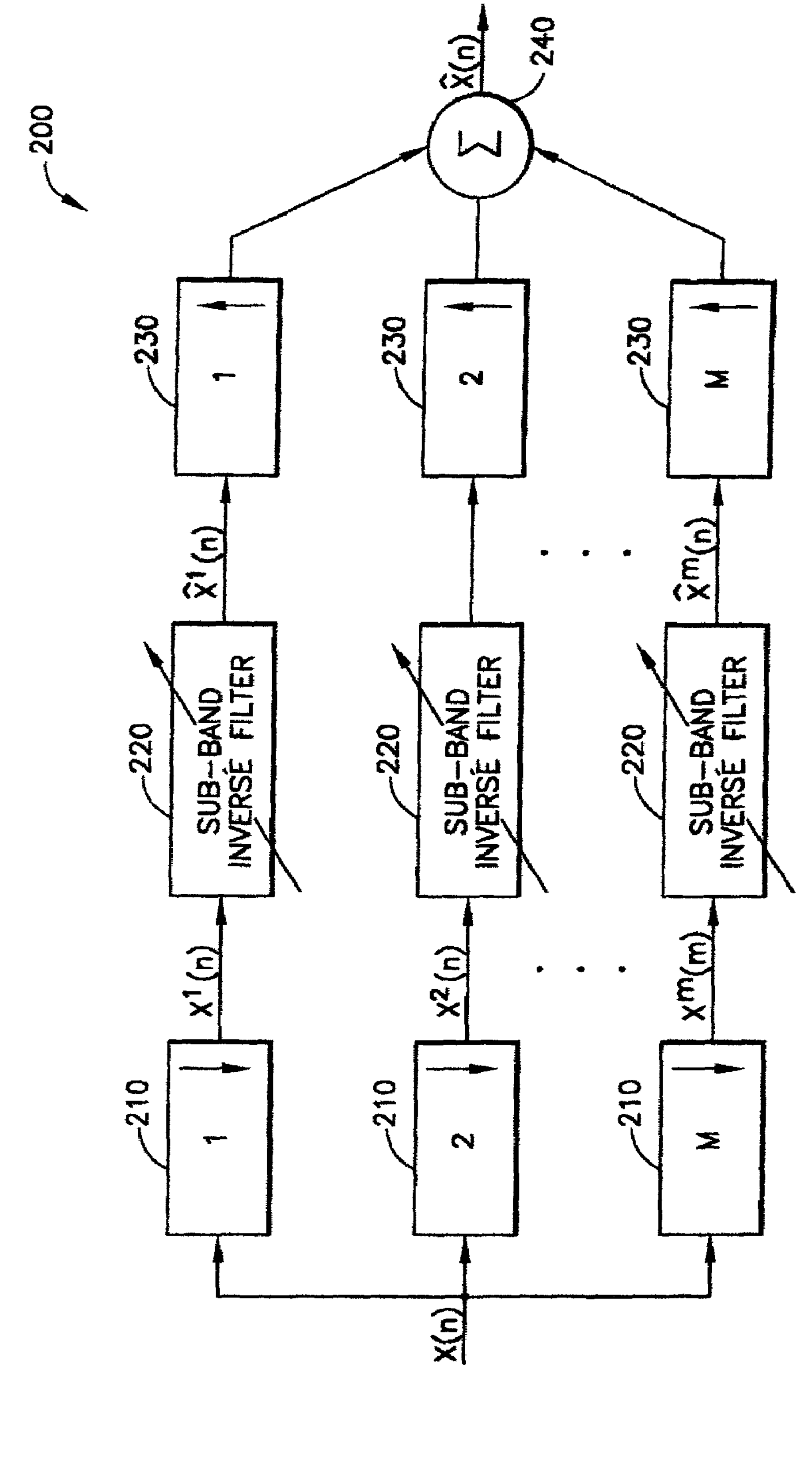
FIG. 3 is a more detailed schematic of the filtering unit.

FIG. 3 describes the filtering unit 200, which is included in computer 110. This unit is used for processing the audio signal in order to compensate for the effects of the reproduction medium, which includes the speakers and the environment in which the system is operating. Unit 210 is a sub-sampling and decimation process. Unit 220 is the is the sub-band inverse filter, and unit 230 is the up-sampling or interpolation process. Unit 240 is an additional stage, where signals from various interpolation stages 230 are added together to form the desired audio output signal.

The preferred embodiment consists of two phases. The first phase is the training phase, and the second phase is the processing phase.

Again, referring to FIG. 2, the training phase is the first phase of the implementation. The audio signal produced by unit 110 is reproduced through the speaker units 120. The audio signal travels through the reproduction medium, which comprises the speakers 120 and the environment. During the training phase, a unique set of frequency tones is generated by the training unit 400, and reproduced by the speakers 120. The training signal shall comprise of at least one frequency tone in each of the M frequency sub-bands that collectively span the range of frequencies that comprise all audio signals generated by audio data source 140. The selection of an appropriate value for M and the values for M frequency sub-bands may be done using guidelines for sub-band coding of speech and audio signals, such as those described in [4], and incorporated herein by reference. The audio signal thus reproduced by speakers 120 is received and digitally recorded by microphone 130. The digitized signal is separated into M frequency sub-bands, using standard sub-band filtering techniques such as those described in [4], and incorporated herein by reference. The filtered signal is then used to estimate the parameters of the sub-band inverse filters 220 (See FIG. 3), using standard sub-band filter estimation procedures, such as those described in [3] and [4], and incorporated herein by reference. Once the estimation of the filter parameters of the sub-band inverse filters is done, the training phase is completed. The training phase may be invoked whenever additional tuning of the sub-band filters are desired, such as when there is a change in the environment, or at regular intervals.

Again referring to FIG. 2, once the training phase is complete, the processing phase may be used to improve the quality of any digitized audio signal to be reproduced by reproduction medium 300. The sub-band inverse filters 220 may be implemented as a transversal filter. Construction of transversal filters may be done as described in [4], and incorporated herein by reference. (See FIG. 3.) The audio signal to be reproduced is first passed through unit 210 for sub-sampling and decimation, filtered by sub-band inverse filters 220, up-sampled or interpolated by unit 230, and added together by unit 240. The processed audio signal is sent to speakers 120 for reproduction.

Figure 4:
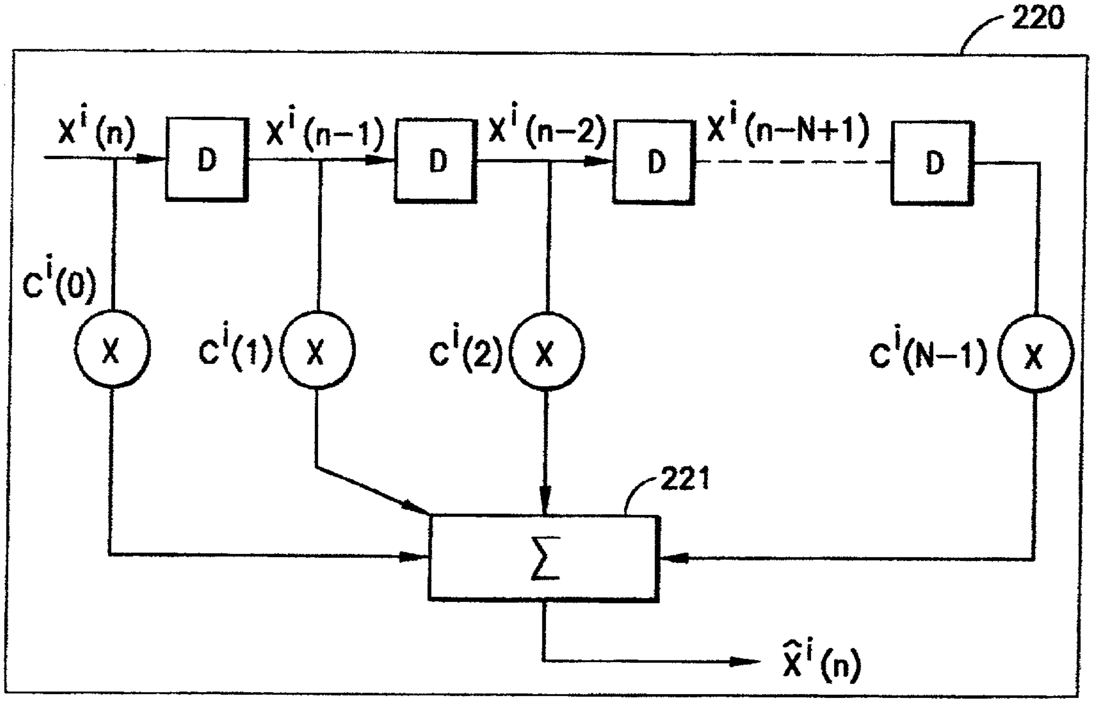
FIG. 4 is a schematic of the sub-band inverse filter.

FIG. 4 illustrates the detailed implementation of the sub-band inverse filter 220. The filter parameters to be estimated during the training phase are the coefficients $c^i(0), \ldots c^i(N-1)$ for each of the M sub-band filters, where $i=1, \ldots, M$. The input to filter is $x^i(n)$ which is one of the M sub-band components of the audio source signal X(n). Shown also are N delay elements where N is the length of the filter. N varies with the performance requirements and the processing power of computer 110. At each sampling of the source signal X(n), the components $x^i(n)$, $x^i(n-1), \ldots x^i(n-N+1)$ are multiplied by corresponding coefficients $c^i(0)$, $c^i(1), \ldots, c^i(N-1)$. The products are then added by accumulator 221 to form the output component $\hat{x}^i(n)$. The above is repeated for each of the M sub-bands, and the output components $\hat{x}^i(n)$ for $i=1, \ldots, M$, to form the final output signal which is sent to the reproduction medium to be played out.

REFERENCED

1. J. N. Mourjopoulos, "Digital Equalization of Room Acoustics," Journal of the Audio Engineering Society, Vol. 42, No. 11, pp. 884–900, November 1994.
2. J. Kontro, "Digital Car Audio System," IEEE Transactions on Consumer Electronics, Vol. 39, No. 3, pp. 514–521, August 1993.
3. S. Haykin, "Adaptive Filter Theory," Third Edition, Prentice-Hall,
4. W. B. Klein and K. K. Paliwal, (editors), "Speech Coding and Synthesis," Elsevier, 1995. 1996.

Having thus described our invention, what we claim as new and desire to secure by Letters Patent is:

1. Apparatus for rapidly enhancing audio quality of an input audio signal in a portable computing system having limited resources and having a reproduction medium with unknown characteristics, comprising:

a. a generator component for generating a predetermined finite set of M single frequency tones and for passing said set of tones to said reproduction medium to generate a subsequent output signal;

b. a set of sub-band filters for receiving said subsequent output signal wherein each of the sub-band filters passes at least a frequency corresponding to one of the M tones;

d. an estimating component for estimating the unknown characteristics of said reproduction medium by examining outputs of each of said sub-band filters after passing said subsequent output signal through said medium to produce gain estimates; and e. at least one filter construction component for dynamically constructing a set of sub-band inverse filters to compensate for the estimated characteristics of the reproduction medium, wherein, before passing an input audio signal through said reproduction medium, said audio signal are passed through said inverse filters, thereby improving the audio quality after the audio signal passes through said reproduction medium.

2. The apparatus of claim 1 further comprising decomposition component for decomposing the audio signal into frequency sub-bands prior to passing the audio signal through the inverse filters.

3. The apparatus of claim 1 further comprising a reconstruction component for reconstructing an output audio signal from the filtered frequency sub-bands.

4. The apparatus of claim 2 further comprising a reconstruction component for reconstructing an output audio signal from the filtered frequency sub-bands.

5. The apparatus of claim 2 further comprising a pre-emphasis component for pre-emphasizing the signal after said decomposing based on the gain estimates.

6. The apparatus of claim 3 further comprising a pre-emphasis component for pre-emphasizing the signal after said decomposing based on the gain estimates.

7. The apparatus of claim 4 further comprising a pre-emphasis component for pre-emphasizing the signal after said decomposing based on the gain estimates.

8. A program storage device readable by machine, tangibly embodying a program of instructions executable by the machine to pertain method steps for rapidly enhancing audio quality of an input audio signal in a portable computing system having limited resources and having a reproduction medium with unknown characteristics, said method comprising:

a. generating a predetermined finite set of M single frequency tones;
b. passing said set of tones through said reproduction medium to generate a subsequent output signal;
c. passing said subsequent output signal through a set of sub-band filters, each of the sub-band filters passing at least a frequency corresponding to one of the M tones;
d. estimating the unknown characteristics of said reproduction medium by examining outputs of each of said sub-band filters after passing said subsequent output signal through said medium to produce gain estimates;
e. dynamically constructing a set of sub-band inverse filters to compensate for the estimated characteristics of the reproduction medium; and
f. before passing an input audio signal through said reproduction medium, passing said audio signal through said inverse filters, thereby improving the audio quality after the audio signal passes through said reproduction medium.

* * * * *